(12) United States Patent
Favre et al.

(10) Patent No.: US 9,779,972 B2
(45) Date of Patent: Oct. 3, 2017

(54) METHOD AND DEVICE FOR CONTROLLING THE MANUFACTURE OF SEMICONDUCTOR BY MEASURING CONTAMINATION

(75) Inventors: Arnaud Favre, Annecy (FR); Julien Bounouar, Annecy (FR)

(73) Assignee: ADIXEN VACUUM PRODUCTS, Annecy (FR)

( * ) Notice: Subject to any disclaimer, the term of this patent is extended or adjusted under 35 U.S.C. 154(b) by 689 days.

(21) Appl. No.: 13/516,376

(22) PCT Filed: Dec. 16, 2010

(86) PCT No.: PCT/EP2010/069973
§ 371 (c)(1),
(2), (4) Date: Jun. 15, 2012

(87) PCT Pub. No.: WO2011/073348
PCT Pub. Date: Jun. 23, 2011

(65) Prior Publication Data
US 2012/0259449 A1    Oct. 11, 2012

(30) Foreign Application Priority Data
Dec. 18, 2009   (FR) ..................................... 09 59235

(51) Int. Cl.
*G06F 19/00*    (2011.01)
*B08B 7/04*    (2006.01)
(Continued)

(52) U.S. Cl.
CPC .. *H01L 21/67253* (2013.01); *H01L 21/67389* (2013.01); *Y02P 90/28* (2015.11)

(58) Field of Classification Search
CPC .......... B01D 53/22; G01N 1/22; G01N 15/06; H01L 21/06
(Continued)

(56) References Cited

U.S. PATENT DOCUMENTS 3,250,038 A    5/1966   Steel
5,284,412 A    2/1994   Shiraiwa et al.
(Continued)

FOREIGN PATENT DOCUMENTS

CN    1351758 A    5/2002
CN    1631751 A    6/2005
(Continued)

OTHER PUBLICATIONS

International Search Report of the ISA for PCT/EP2010/069973 dated Apr. 14, 2011.
(Continued)

*Primary Examiner* — Mohammad Ali
*Assistant Examiner* — Md Azad
(74) *Attorney, Agent, or Firm* — Daly, Crowley, Mofford & Durkee, LLP (57) ABSTRACT

A device for handling substrates within a semiconductor manufacturing plant having substrate processing equipments, substrate storage means, substrate transport means, and a manufacturing execution system (MES) functionally related with the substrate processing equipments, the substrate storage means and the substrate transport means, including at least one substrate storage and transport box that is transported by the transport means and stored in the storage means; at least one gas analysis device of the gases forming the internal atmosphere of the substrate storage and transport box, which produces analysis signals representative of the quantity of the critical gas that is likely to generate molecular contamination, which is present in the storage and transport box; and an execution device which pilots the transport means and the storage means, with the execution device comprising instructions for detecting a molecular decontamination need as a function of analysis signals emitted by the gas analysis device.

13 Claims, 3 Drawing Sheets

(51) Int. Cl.

| | | |
|---|---|---|
| *B08B 9/04* | (2006.01) | |
| *B08B 3/00* | (2006.01) | |
| *B01L 1/04* | (2006.01) | |
| *H01L 21/67* | (2006.01) | |
| *H01L 21/673* | (2006.01) | |

(58) Field of Classification Search
USPC ....... 700/121, 112, 96; 454/187; 134/18, 24, 134/26
See application file for complete search history.

(56) References Cited

U.S. PATENT DOCUMENTS

| | | | |
|---|---|---|---|
| 5,616,208 | A | 4/1997 | Lee |
| 5,827,118 | A | 10/1998 | Johnson et al. |
| 6,193,601 | B1 | 2/2001 | Torczynski |
| 6,287,023 | B1 | 9/2001 | Yaegashi et al. |
| 6,346,986 | B1 | 2/2002 | Nguyen |
| 6,368,411 | B2 * | 4/2002 | Roberson et al. ............ 118/715 |
| 6,422,247 | B2 * | 7/2002 | Yoshikawa et al. ......... 134/22.1 |
| 7,603,195 | B2 * | 10/2009 | Puri et al. ..................... 700/112 |
| 2001/0026355 | A1 | 10/2001 | Aoki et al. |
| 2002/0085183 | A1 | 7/2002 | Wu et al. |
| 2002/0126269 | A1 | 9/2002 | Sato |
| 2002/0192579 | A1 | 12/2002 | Kamono |
| 2003/0150329 | A1 | 8/2003 | Kamono |
| 2004/0023419 | A1 | 2/2004 | Kishkovich et al. |
| 2005/0045209 | A1 * | 3/2005 | Tan .................................. 134/18 |
| 2006/0292037 | A1 | 12/2006 | Favre et al. |
| 2007/0035715 | A1 | 2/2007 | Choi et al. |
| 2007/0062561 | A1 | 3/2007 | Koch et al. |
| 2009/0016855 | A1 | 1/2009 | Hofmeister et al. |
| 2009/0162170 | A1 | 6/2009 | Yamagishi et al. |
| 2009/0263216 | A1 | 10/2009 | Favre et al. |
| 2010/0021273 | A1 | 1/2010 | Polyak et al. |
| 2010/0065467 | A1 | 3/2010 | Murata |
| 2010/0282272 | A1 * | 11/2010 | Godot et al. ....................... 134/1 |
| 2013/0097802 | A1 | 4/2013 | Rioufrays et al. |
| 2013/0152977 | A1 | 6/2013 | Favre et al. |

FOREIGN PATENT DOCUMENTS

| | | |
|---|---|---|
| CN | 101071760 A | 11/2007 |
| DE | 4237767 A1 | 5/1994 |
| EP | 0 582 019 A1 | 2/1994 |
| EP | 1 703 547 A2 | 9/2006 |
| EP | 1 724 474 A1 | 11/2006 |
| FR | 2 908 674 A1 | 5/2008 |
| JP | H 05-007720 A | 1/1993 |
| JP | H 0786187 A | 3/1995 |
| JP | H 11168135 A | 6/1999 |
| JP | 2001-267200 | 9/2001 |
| JP | 2002-372777 A | 12/2002 |
| JP | 2004-047929 A | 2/2004 |
| JP | 2005-093697 A | 4/2005 |
| JP | 2009/538000 | 10/2009 |
| JP | 2010/040979 A | 2/2010 |
| TW | 2004/26971 A | 12/2004 |
| TW | I 275911 B | 3/2007 |
| WO | WO 99/45576 | 9/1999 |
| WO | WO 0116653 A1 | 3/2001 |
| WO | WO 03/034475 A1 | 4/2003 |
| WO | WO 2004/097927 A1 | 11/2004 |
| WO | WO 2007/033257 A2 | 3/2007 |
| WO | WO 2007/135347 A1 | 11/2007 |
| WO | WO 2009/021941 A1 | 2/2009 |

OTHER PUBLICATIONS

English Translation of Taiwanese Office Action dated May 28, 2014 corresponding to TW Pat. Appl. No. 099143728 4 pages.
IPO Search Report dated Mar. 30, 2014 corresponding to TW Pat. Appl. No. 099143728, 1 page.
Chinese Office Action with English translation dated Dec. 5, 2014; for Chinese Pat. App. No. 2011/80032234.9; 7 pages.
Chinese Office Action with English translation dated Mar. 28, 2014; for Chinese Pat. App. No. 2011/80032234.9; 9 pages.
INPI Preliminary Search Report and Written Opinion dated Sep. 15, 2010 for French Appl. No. FR1055187; 7 pages.
INPI Preliminary Search Report dated Nov. 8, 2007 for French Appl. No. FR0752936; 3 pages.
Japanese Notice of Reasons for Rejection English Translation dated Jun. 30, 2015 for Japanese Pat. No. 2013-527580; 18 pages.
Japanese Notice of Reasons for Rejection with English Translation dated Apr. 28, 2015 for Japanese Patent Appl. No. 2013-517235; 4 pages.
Japanese Notice of Reasons for Rejection with English Translation dated May 7, 2015 for Japanese Patent Appl. No. 2012-543768; 7 pages.
Office Action dated Mar. 9, 2016 for U.S. Appl. No. 13/819,409; 22 pages.
Office Action dated Oct. 27, 2015; For U.S. Appl. No. 13/806,318; 25 pages.
PCT International Preliminary Report on Patentability and Written Opinion of the ISA dated Aug. 19, 2011; For PCT Pat. App. No. PCT/EP2011/060749; 8 pages.
PCT International Preliminary Report on Patentability and Written Opinion of the ISA for PCT/EP2011/065408 dated Mar. 21, 2013; 7 pages.
PCT International Search Report of the ISA for PCT/EP2011/065408 dated Dec. 13, 2011; 3 pages.
PCT International Search Report of the ISA with English Translation dated Aug. 19, 2011 for PCT Appl. No. PCT/EP2011/060749; 8 pages.
PCT Written Opinion of the ISA with English Translation for PCT/EP2011/060749 dated Aug. 19, 2011 for PCT Appl. No. PCT/EP2011/060749; 15 pages.
Response dated Aug. 4, 2015 to Restriction Requirement dated Jul. 6, 2015; For U.S. Appl. No. 13/806,318; 2 pages.
Response dated Jan. 27, 2016 to Office Action dated Oct. 27, 2015 for U.S. Appl. No. 13/806,318; 19 pages.
Response dated Nov. 30, 2015 to Restriction Requirement dated Nov. 4, 2015; For U.S. Appl. No. 13/819,408; 4 pages.
Restriction Requirement dated Jul. 6, 2015; For U.S. Appl. No. 13/806,318; 9 pages.
Restriction Requirement dated Nov. 4, 2015; For U.S. Appl. No. 13/819,408; 8 pages.
Supplemental Preliminary Amendment dated Aug. 4, 2015; For U.S. Appl. No. 13/806,318; 8 pages.
Supplemental Preliminary Amendment dated Sep. 1, 2015; For U.S. Appl. No. 13/806,318; 8 pages.
Taiwanese Office Action and Translation dated Jul. 13, 2015 for TW Appl. No. 100132232; 15 pages.
Taiwanese Office Action and Translation dated Jun. 30, 2015; For TW. App. No. 100121841; 6 pages.
Translation of Japanese Notice of Reasons for Rejection for Japanese Appl. No. 2013-527580 dated Feb. 9, 2016; 9 pages.
Notice of Allowance dated May 25, 2016 for U.S. Appl. No. 13/806,318; 11 pages.

* cited by examiner

FIG.1

FIG. 2

METHOD AND DEVICE FOR CONTROLLING THE MANUFACTURE OF SEMICONDUCTOR BY MEASURING CONTAMINATION

CROSS REFERENCE TO RELATED APPLICATIONS

This application is a National Stage application of PCT/EP2010/069973 filed on Dec. 16, 2010 and published in the French language, and entitled "METHOD AND DEVICE FOR CONTROLLING THE MANUFACTURE OF SEMICONDUCTOR BY MEASURING CONTAMINATION" which claims priority to French application FR0959235 filed on Dec. 18, 2009.

BACKGROUND

The present invention concerns the methods and devices implemented to manufacture semiconductors or microelectromechanical systems (MEMS) in semiconductor manufacturing plants. In particular, the invention pertains to means for increasing the yield of semiconductor manufacturing plants.

In a semiconductor manufacturing plant, substrates such as semiconductor wafers and/or masks undergo treatments in process chambers, carrying out various steps such as steps of depositing material and steps of etching. Between each step, the substrates are moved between various equipments.

When microelectronics chips are manufactured, the considerable number of processing steps (about 400 of them) leads to sequencing restrictions between the processing equipment. The substrates are transferred between the equipments. Since wait times between equipment may be long, typically several hours, it is necessary to store the substrates.

Thus, in a semiconductor manufacturing plant, there is provided a plurality of substrate processing equipment, substrate storage means, substrate transport means, and a manufacturing execution system (MES) functionally related with the substrate processing equipment, with substrate storage means and substrate transport means.

The manufacturing execution system (MES) is thereby adapted to control the substrate processing equipment, in order to carry out satisfactory steps of processing. The manufacturing execution system also gives the order to take the substrates out of the storage means, and controls the substrate transport means to lead the substrates to the next processing equipment in the order of the process steps.

Given the number of steps of the process to be implemented, in order to increase manufacturing productivity, substrates have traditionally been processed in batches. It is therefore batches of substrates which are stored, moved, and processed.

But the need to increase productivity persists. To achieve this, it has been sought to automate the movement of batches of substrates, and to optimize these movements. Thus, in order to improve manufacturing output, it has been proposed in document U.S. Pat. No. 7,610,111 to optimize the movement of batches of substrates by examining the orders of priority dictated by the load of the substrate processing equipment, by examining the batches of substrates waiting in the storage means, and by choosing the movements of batches of substrates so as to minimize storage time.

SUMMARY

Thus, currently, semiconductor manufacturing plants manage a maximum fixed time between certain steps to avoid problems related to these wait times. These durations are fixed empirically, by examining the minimum possible time in relation to the amount of equipment available for the next step, and the maximum time past which pollution problems due to storage might appear.

Despite this progress, it has been observed that the yield of semiconductor manufacturing plants is still insufficient, in particular due to the essentially variable nature of the sequences of processing steps for manufacturing different semiconductors or microelectromechanical systems in the same plant.

This is because the maximum storage time of the substrates depends on a large number of factors: it depends on the final product that the plant must manufacture, it being understood that a plant generally manufactures more than ten different products which must pass through the same processing equipment in different sequences and steps; it depends on the number of substrates to be processed and the number of substrates present in the processed batches; and it depends on the history of the substrate batches.

One of the limits of known systems is the lack of flexibility and adaptability. For example, managing the maintenance of processing equipment poses adaptation problems, by altering possible sequences of steps. The incorporation of a new product or new technology is poorly handled in this sort of substrate batch flow management.

Often the maximum storage times are exceeded, and increasing defects are observed in the manufactured products.

The solution proposed by the present invention is therefore how to further increase the yield and flexibility of semiconductor manufacturing plants.

The idea at the basis of the invention is that the observed decreases in yields mainly results from pollution problems that appear during transition phases between the processing equipments. These pollution problems are related to the gas surrounding the substrate batches, as the gases react and create defects on the substrates. These defects are both proportional to the concentration of gases present and the contact time.

A dose may be defined as the concentration of the gas multiplied by time. Beginning at a certain dose, it is assumed that problems will appear on the substrates.

Currently, the batches of substrates are contained in mini-environments, made up of storage and transport boxes such as front-opening unified pods (FOUP), and standard mechanical interfaces (SMIF). This reduces the volume of the gas atmosphere in contact with the batches of substrates. However, this decrease in volume does not yet have a sufficient effect on the reliability of the overall manufacturing process and on its yield.

To that end, the present invention is focused on airborne molecular contamination (AMC), resulting from the presence of reactive gases in the internal atmosphere of storage and transport boxes.

This airborne molecular contamination is a generic term for molecules that are likely to react with the surfaces of semiconductor wafers. These chemical reactions may make a semiconductor wafer unusable. In some cases, these molecules appear in the form of salts or metal particles, but most commonly they constitute gaseous substances.

For example, they include acids, basis, condensable elements, and doping elements.

These molecules may come from the air inside the semiconductor manufacturing plant. However, these molecules mainly come from residue from semiconductor substrate processing steps during manufacture.

The storage and transport boxes are generally made of materials such as polycarbonate, which may in some cases contain concentrations of contaminants, particularly including organic, basic, amino, acidic, and doping contaminants, which may result from the manufacture of the storage and transport boxes themselves and/or the way they are used.

Furthermore, during the manufacture of semiconductors, the storage and transport boxes are handled, which leads to the formation of polluting particles that become lodged within the walls of the storage and transport boxes, and which contaminate them. The particles stuck to the walls of the storage and transport boxes may then become unstuck, falling onto the substrates contained within these boxes and deteriorating them. It is also observed that the contamination of the substrates contained within a storage and transport box increases both as a function of the quantity of contaminants present within the box, and as a function of the substrates duration of exposure to the atmosphere within the storage and transport box.

Regular cleaning of these pods by washing them with a liquid such as deionized water is therefore planned. This washing stage, which lasts between 5 and 7 minutes, is followed by a much longer drying stage (between 5 and 8 hours) including, for example, a phase in which the transport pods are heated by convection of hot air heated by infrared radiation, and centrifuged, followed by a phase in which the transport pods are left in the open air. Despite the drying, water residue may remain stuck onto the walls of the storage and transport boxes.

In order to decrease the pollution generated by the semiconductor manufacturing process equipments, transport box processing methods and devices have been designed, such as those described in the document WO-2009/021941.

In order to decontaminate a storage and transport box and the batch of substrates that it contains, a method and device for decontaminating an enclosed environment as described in the document WO 2007/135347 A1 have also been proposed.

Finally, to measure the contamination directly within the storage and transport boxes, a measuring device as described in the document EP-1 703 547 has been proposed.

However, until now, these measurement and decontamination means have been used in direct combination with one or more particular devices intended to execute one or more manufacturing method steps, in order to directly process the pollution resulting from these steps of manufacturing at the source. However, this remains insufficient for enabling a satisfactory increase in the output and flexibility of the semiconductor manufacturing plant.

In order to achieve the goal of the invention, the idea is to manage the sequencing restrictions of successive movements of substrate batch storage and transport boxes, by carrying out a dynamic management based upon the measurement of the dose of a critical gas within the storage and transport boxes. The decision on the course of the batches of substrates contained within the storage and transport box, and the decision on how much time to leave between the successive substrate-processing steps, are dynamically drawn from this information.

Thus, according to a first aspect, the invention proposes a device for handling substrates within a semiconductor manufacturing plant having substrate processing equipments, substrate storage means, substrate transport means, and a manufacturing execution system (MES) functionally related with the substrate processing equipments, with substrate storage means and substrate transport means. The device further comprises:

at least one substrates storage and transport box, each of the boxes being capable of containing a batch of substrate, which is transported by the transport means and stored in the storage means, at least one device to analyze the gases forming the internal atmosphere of the substrate storage and transport box, which produces analysis signals representative of the quantity of the critical gas that is likely to generate molecular contamination, which is present in the storage and transport box, an execution device which controls the transport means and the storage means, with the execution device comprising instructions for detecting a molecular decontamination need as a function of analysis signals emitted by the gas analysis device.

According to a second aspect, the invention proposes a method for handling substrates within a semiconductor manufacturing plant, comprising the steps of:

distributing the substrates into batches each contained within a storage and transport box, analyzing the gases in the internal atmosphere of a storage and transport box, selectively directing the storage and transport box to a storage means work to a decontamination station as a function of the result of the gas analysis.

The analysis carried out is both a qualitative analysis of at least one of the gas species present in the storage and transport box, and a quantitative analysis of that gas species.

Due to the fact that movements of batches of substrates are managed based on real knowledge of the current quantity of airborne contamination (AMC) in the storage and transport boxes, it becomes possible to monitor or provide for the change in the contamination of the substrates in the storage and transport boxes, such that some storage times may be lengthened without any risk whenever foreseeable contamination is low, preferring to reduce storage and transport times if there are any storage and transport boxes containing more contaminants, or more reactive contaminants. This increases flexibility in the choices available to optimize production time.

Simultaneously, reliability is increased through strict control of contamination and through fast information on any excessive contamination levels.

In practice, the program saved in the execution device may contain:

instructions for producing and scanning the analysis signals, instructions for carrying out a comparison between the analysis signals and recorded threshold values, instructions for controlling the transport means and the storage means depending on the result of this comparison.

Preferentially, it is provided that:

the program saved in the execution device further contains an algorithm for simulating the foreseeable change in contamination within the substrate storage and transfer box as a function of analysis signals, the instructions for controlling the transport means and the storage means act as a function of the simulation result.

Thus, the change in contamination may be anticipated, in order to further optimize the choices of processing steps and processing times.

The device therefore actively affects the choice of substrate storage and transfer boxes whose contents will be processed.

Furthermore, to further increase choice options, it may be provided that:

the device further comprises at least one internal decontamination station which contains a vacuum when closed in order to internally decontaminate at least one transport and storage box, the program saved in the execution device further contains instructions for detecting an internal decontamination need of the storage and transport box and to command the transport means and internal decontamination means in order to ensure the internal decontamination of the storage and transport box.

An "internal decontamination station which contains a vacuum when closed" refers to a decontamination station, such as one of the type described in the document WO-2007/135347. A closed storage and transport box, whether or not containing substrates, is placed within the decontamination station, and the gas contained within the station is pumped out. As the storage and transport box normally comprises an outlet, the gases contained within the storage and transport box are simultaneously pumped out, thereby ensuring the total or partial evacuation of contaminants.

In practice, the program saved in the execution device may contain instructions for ordering the analysis of the gases contained within a storage and transport box at the outlet of a substrate processing equipment, to convey the storage and transport box to the storage means if the level of the critical gas, such as HF, measured by the gas analysis means, is less than a first predetermined threshold, and to convey the storage and transport box to an internal decontamination station containing a vacuum if the measured level of critical gas is greater than said first predetermined threshold.

As an alternative or complement, it may be provided that:

the device further comprises at least one open, thermal decontamination station containing a vacuum for the open decontamination of at least one empty storage and transport box, the program saved in the execution device further contains instructions for detecting an open, thermal decontamination need involving a vacuum and for ordering the transport means and open decontamination means in order to ensure the open vacuum decontamination of the storage and transport box, or in order to ensure its quarantining.

An open, thermal decontamination station containing a vacuum refers to a decontamination station, such as one of the type described in the document WO-2009/021941. A storage and transport box, empty of any substrates, is placed within the decontamination station. After steps of washing and drying, the surfaces of the box are subjected to the combined action of subatmospheric gas pressure and infrared radiation Advantageously, the program saved in the execution device may contain instructions for commanding the analysis of the gases within the empty, closed storage and transport box after a wait time following its being cleaned, to convey the empty storage and transport box into an open, thermal decontamination station containing a vacuum for desorption for a period of time less than 5 hours, preferentially between 2 and 5 hours, if the measured level of a critical gas in the storage and transport box is between a second predetermined threshold and a third predetermined threshold, and to convey the storage and transport box into the open, thermal decontamination station containing a vacuum for desorption for a period of time greater than 10 hours, preferentially between 10 and 20 hours, if the measured level of critical gas is greater than the third predetermined threshold.

In this manner, the decontamination steps can be controlled, their duration can be optimized, and their effect and sufficiency may be verified efficiently.

With respect to the method for handling substrates according to a second aspect of the invention, it may advantageously be provided that, after a step of processing, the storage and transport box is internally decontaminated in a vacuum while closed if the measured level of a critical gas, such as HF, in the internal atmosphere of the storage and transport box is greater than a first predetermined threshold.

In this situation, after a step of cleaning, the storage and transport box may be thermally decontaminated in a vacuum while open for a period of time less than 5 hours, preferentially between 2 and 5 hours, if the measured level of a critical gas in the empty, closed storage and transport box is, after a wait time longer than 2 hours, between a second predetermined threshold and a third predetermined threshold, and for a period of time longer than 10 hours, preferentially between 10 and 20 hours, if said measured level of critical gas is greater than the third predetermined threshold.

It may advantageously be provided for there to be a step of learning in order to determine the permissible limits of critical gas quantities past which defects may appear in the products manufactured by the method.

It may also be provided that the step of analyzing the gases in the internal atmosphere of a storage and transport box is carried out periodically during its storage in the storage means.

BRIEF DESCRIPTION OF THE DRAWINGS

Other objects, characteristics, and benefits of the present invention will become apparent from the following description of particular embodiments, made with reference to the attached figures, in which:

FIG. 3 illustrates a storage means equipped with a contamination measurement device and a transfer robot, according to one embodiment of the present invention.

DETAILED DESCRIPTION

Figure 1:
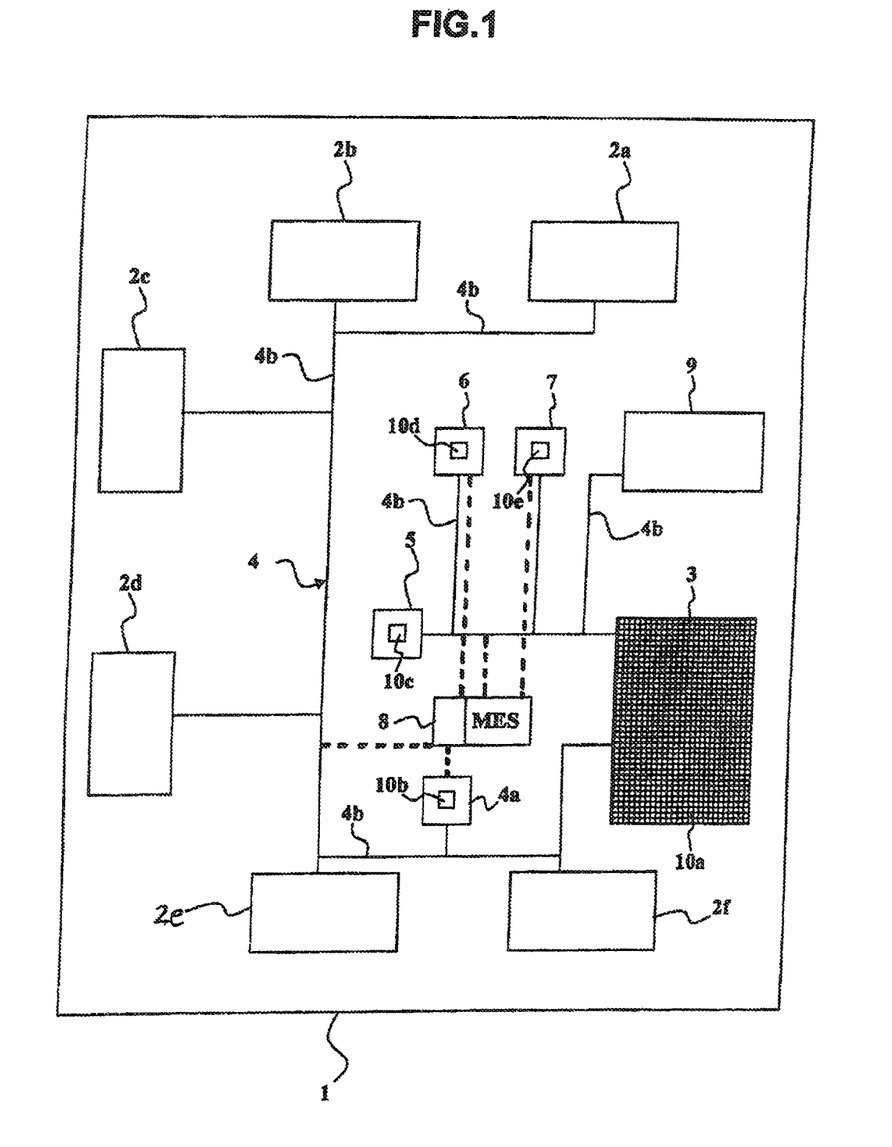
FIG. 1 is a functional schematic view of a semiconductor manufacturing unit according to one particular embodiment of the present invention.

First, we shall examine the schematic diagram in FIG. 1, incorporating a substrate-handling device according to one embodiment of the invention. Thus, a semiconductor manufacturing unit 1 is distinguished, having a plurality of substrate processing equipments 2a, 2b, 2c, 2d, 2e, and 2f, the number of which is given purely as an example. Each processing equipment 2a-2f may comprise a reactor for depositing or etching, making it possible to execute in a sequence various steps of processing semiconductor substrate batches.

The semiconductor manufacturing unit 1 further comprises substrate storage means 3, substrate transport means 4, and a manufacturing command system MES which is functionally related with the substrate processing equipment 2a-2f, the substrate storage means 3, and the substrate transport means 4. In the embodiment depicted in FIG. 1, the semiconductor manufacturing unit 1 further comprises a gas analysis device 5, an internal decontamination station containing a vacuum 6, and an open thermal decontamination station containing a vacuum 7.

The manufacturing command system MES comprises an execution device 8 with a processor and saved program, capable of controlling the transport means 4 and the storage means 3 as a function of signals that it receives from the gas analysis device 5.

Finally, a reject device 9 may be distinguished, into which may be directed storage and transport boxes declared unfit for use by the gas analysis device.

FIG. 1 is a purely schematic depiction of a semi conductor manufacturing plant 1. The number of processing equipments 2a-2f may be very different from six, depending on the plant capacity. The substrate storage means 3 may be centralized, as depicted in FIG. 1. As an alternative or complement, they may be distributed into multiple storage areas. The gas analysis means 5 may be greater in number, for example distributed at the output of certain substrate processing equipments 2a 2f, integrated into one or more substrates storage means 3, or coupled to one or more decontamination stations 6 or 7.

The substrates to be processed are divided into batches each contained within a storage and transport box 10a-10e.

The storage and transport boxes 10a-10e contain an internal atmosphere and potentially one or more substrates such as a semiconductor wafers. The storage and transport boxes 10a-10e each define an enclosed space which is separated from the environment in which the substrates are used and transported, by a peripheral wall equipped with an opening for bringing substrates through that is covered by a door.

In particular, a distinction is made between front-opening standardized substrate transport and storage pods know as FOUPs ("Front Opening Unified Pod"), or bottom-opening pods known as SMIFs ("Standard Mechanical Interface Pod"), standardized photomask transport and storage pods known as RSPs ("Retical SMIF Pod"), and substrate transport pods for the solar power industry.

In general, these storage and transport pods contain an internal atmosphere at atmospheric pressure, and are intended to remain within the atmospheric pressure of the atmosphere present within the semiconductor manufacturing plant 1.

Pods may also be planned to be stored in a vacuum, if necessary. These the storage and transport pods 10a-10e are made of materials such as polycarbonate, which may in some cases contain concentrations of organic, basic, amino, acidic, and doping contaminants (AMCs), which may result from the manufacture of the storage and transport boxes themselves and/or the way they are used.

FIG. 1 shows the storage and transport pods 10a-10e, distributed into different stations or parts of the device.

During a method of manufacturing semiconductors or microelectromechanical systems, the substrates undergo a large number of processing steps which are carried out in the substrate processing equipments 2a-2f. A single substrate processing equipment cannot carry out all of the operations. It is therefore necessary to periodically transport the batches of substrates from one substrate processing equipment to another.

As the durations of the processing steps are different in the various substrate processing equipments 2a-2f, and the steps carried out by each substrate processing equipment 2a-2f are not the same in number, is necessary to provide "buffer zones" by storing the substrates in substrate storage means 3.

Thus, the substrate transport means 4 make it possible to transport the substrate storage and transport boxes 10a-10e within the semiconductor manufacturing plant 1. These substrate transport means 4 may, for example, comprise a plurality of shuttles 4a for transporting a plurality of storage and transport boxes such as the box 10b, and a transport system 4b defining paths of movement for moving the shuttles 4a within the semiconductor manufacturing plant 1.

The substrate storage means 3 are capable of storing a plurality of substrate storage and transport boxes such as the box 10a, and comprise a storage areas and an internal box handling means between the storage areas and input-output areas.

FIG. 3 schematically depicts such substrate storage means 3, with storage shelves such as the shelf 3a, and with a transfer robot 3b to an input-output area 3c.

The gas analysis device 5, depicted in FIG. 1, may, for example, in FOUP storage and transport boxes, be a device as described in the document EP-1,703,547.

In the gas analysis device 5, the internal atmosphere of the storage and transport box 10c is brought in contact with the IMS ("Ion Mobility Spectrometer") or IAMS ("Ion Attachment Mass Spectrometer") gas analysis cell. In IMS technology, a sample of gas coming from the internal atmosphere of the storage and transport box is introduced to the reactive part of the tube, where the molecules undergo ionization, for example through electron bombardment. The ions resulting from the cracking of the molecules are injected into a region where ion movement occurs, in order to analyze their mobility. Mobility is determined by the speed achieved by the positive and then negative ions in an electrical field. The produced ions are attracted by an electrode which generates electrical current. This electrical current is then treated to obtain the concentration of gases (in ppbv).

In FIG. 1, the schematically depicted device comprises two types of decontamination stations 6 and 7.

The first type of decontamination station 6 is an internal decontamination station containing a vacuum while closed, for the internal decontamination of at least one storage and transport box 10d that may or may not contain a batch of substrates. In this situation, a decontamination stations such as the one described in the document WO-2007/135347 may, for example, be used. The internal decontamination station 6 comprises a sealed chamber with gas-introducation means and gas-pumping means. The closed storage and transport box 10c is placed within the sealed chamber, and the gas contained within the sealed chamber is pumped out. Because the storage and transport box 10c normally comprises an outlet, as is true for FOUP boxes, the pumping simultaneously sucks out the gases contained within the storage and transport box 10c, ensuring the total or partial evacuation of the gasborne contaminants within the box's internal atmosphere.

The internal decontamination station 6 may itself comprise pumped gas analysis means, particularly for making it possible to establish the contamination origin and to monitor the quality of the storage and transport box 10c.

The step of decontamination within the internal decontamination station 6 may be automated, triggered by the reading of signals coming from the gas analysis device 5 into which the storage and transport box 10d had previously been inserted.

The second type of decontamination station 7 is an open thermal decontamination station containing a vacuum, capable of decontaminating an open storage and transport box 10e that is empty of substrate batches. In this situation, a station as described in the document WO-2009/021941 may, for example, be used.

In such an open decontamination station 7, the decontamination of the storage and transport boxes 10e is ensured after they are washed with a liquid such as deionized water. This step of washing, which lasts from 5 to 7 minutes, is followed by a step of drying. During this step of drying, the box's surfaces are subjected to the combined action of subatmospheric gas pressure and infrared radiation, with the storage and transport box 10a being open. Thus, at least most of the contaminants present on the surface or even in the mass of the storage and transport box 10e are thereby eliminated.

According to the invention, the decision of where to transfer a storage and transport box and the batch of substrates that it contains is made dynamically based on the measurement of the dose of critical gas present within the storage and transport box. This decision-making is carried out in principle during each processing step of the method of manufacture, meaning between the steps n and n+1.

Figure 2:
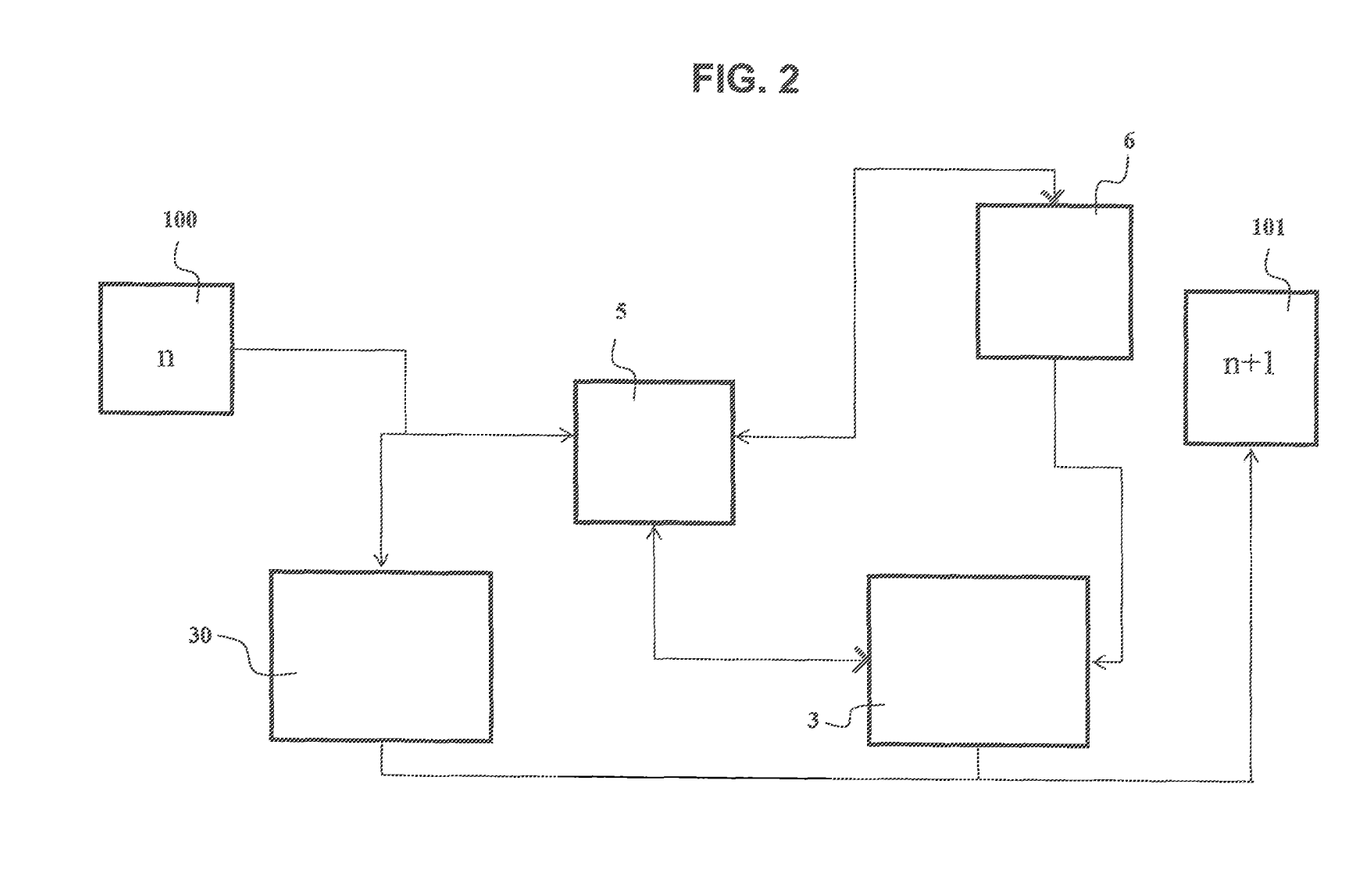
FIG. 2 is a synoptic diagram illustrating the decision-making regarding the movement of a storage and transport box between two steps of a method, according to one embodiment of the present invention.

FIG. 2 depicts such decision-making, in one embodiment according to the present invention. Decision-making may be used at each transition between two successive steps, or only during certain transitions between successive steps.

In the embodiment of FIG. 2, when the storage and transport box comes out of a substrate processing equipment that executed the step n (100), the substrate transport means 4 (FIG. 1) insert it into a gas analysis device 5. The gas analysis device 5 produces the analysis of critical gases, meaning the gas is likely to generate contaminants affecting the substrates contained within the storage and transport box, and compares the results of the analysis to predetermined critical gas concentration limits.

In the most common event, if the concentration of at least one critical gases less than a first threshold lim 1, the order is given to the substrate transport means 40 to transport the storage and transport box to an atmospheric storage device 3. When the time comes, the transport means 4 pickup the storage and transport box within the atmospheric storage means 3, and take it to the substrate processing equipment capable of carrying out step n+1 (101).

In the event that the gas analysis device 5 detects that the concentration of at least one critical gas is greater than the first threshold lim 1, the substrate transport means take the storage and transport box into an internal decontamination station containing a vacuum 6. After internal decontamination, if the internal decontamination station containing a vacuum 6 is itself equipped with a control means involving measuring critical gases, it may directly send the storage and transport box into the atmospheric storage means 3. Failing which, the internal decontamination station containing a vacuum 6 may send the storage and transport box back into the gas analysis device 5, to check the effectiveness of the decontamination.

In a semiconductor manufacturing plant, the storage and transport boxes are emptied out and washed periodically. They must then be dried, and the polluting traces of washing liquids must be eliminated. After a drying period, they are closed. The invention makes it possible to check their state of internal contamination, through a step of gas analysis in a gas analysis device 5, which leads to a decision being made.

If the concentration of at least one critical gas detected by the gas analysis device 5 reaches certain limits, the order is given to the substrate transport means 4 to send the storage and transport box either into the atmospheric storage means 3, for use in the production cycle after inserting a substrate batch, or into a reject area 9, or to an open thermal decontamination station 7.

For example, this means checking an empty FOUP storage and transport box after it is cleaned.

It is known that the mean level of acid in a clean room is less than 0.5 ppbv. It has been noted that the mean level of acid contained in an empty FOUP storage and transport box, meaning one which has no batches of substrates in it, is greater, such as by about 1 ppbv. The difference is due to the acid degassing by the box material.

The acidity of the internal atmosphere of the storage and transport box is therefore measured.

If the measured value of acid is less than a second threshold lim 2, for example on the order of 3 ppbv, it is decided that this level is satisfactory, and the box re-enters the production flow.

If the measured value of acid is greater than a second threshold lim 2 and less than a third threshold lim 3, for example on the order of 6 ppbv, the box is sent to the open decontamination station 7 for desorption for a duration shorter than 5 hours, for example about 4 hours.

If the measured value of acid is greater than the third threshold, lim 3, the box is sent to the open decontamination station 7 for desorption for a duration longer than 10 hours, for example on the other of 15 hours.

For an even greater measured value, one may send the box in the reject area 9.

The measurement cannot be made immediately after cleaning, as the box has just been closed again and therefore mainly contains air from the clean room. It is necessary to wait at least 2 hours.

After open decontamination, the storage and transport box may potentially be filled with a batch of substrates and sent again to the gas analysis device 5, to decide whether to send it back to the atmospheric storage means 3 or to the internal decontamination station 6.

Storage and transport box containing substrates having ultrasensitive surface and which cannot withstand the atmosphere must be stored in a vacuum throughout the wait time. In this case, intermediate storage is provided within vacuum storage means 30 depicted in FIG. 2.

In the event that storing a storage and transport box in atmospheric storage means 3 exceeds a maximum predetermined wait time, it may be provided to automatically place the storage and transport box back into a gas analysis device 5, to verify that the exaggeratedly long storage time has not increase the contamination past a maximum permissible value.

In this case, it is advantageous to provide a gas analysis device 5 integrated directly into the storage means 3 as described, for example, in FIG. 4: an entry airlock 3d containing a gas analysis device 5a is distinguished, making it possible to periodically check the storage and transport boxes contained in storage means 3.

In practice, the decisions between the steps n (100) and n+1 (101) are made automatically by a program saved in the execution device 8 which may itself be integrated into the manufacturing execution system (MES).

In other words, the manufacturing execution system (MES) is functionally connected to the substrate processing equipment 2a-2f, but also to the substrate storage means 3, to the substrate transport means 4, to the gas analysis device 5, and to the decontamination stations 6 and 7.

The program saved in the execution device 8 contains instructions for generating and scanning the analysis signals that come from the gas analysis device(s) 5, instructions for making a comparison between the analysis signals and preset threshold values such as lim 1, lim 2, and lim 3, and instructions for controlling the transport means 4 and the storage means 3 as a function of the result of this comparison.

To further increase the flexibility and reliability of the inventive substrate-handling device, it may further be provided that the program saved in the execution device 8 contains an algorithm that simulates the foreseeable change in pollution within the substrate storage and transport box as a function of the analysis signals. This simulation can involve the chemical reaction capabilities of the contaminant gases, the possible presence of any multiple contaminants, the nature of the substrates present in the storage and transport box.

It is understood that the decisions made must take into account the nature of the substrates to be treated, and the succession of steps that the substrates undergo, as these steps determine whether contaminating bodies are introduced. Thus, when qualifying a new product to be manufactured, learning will be necessary to determine the limits lim 1, lim 2, and lim 3 past which decontamination or reject operations are necessary, meaning past which defects may appear on the manufactured product.

With respect to the determination of the thresholds lim 2 and lim 3 in particular, a statistical analysis may advantageously be conducted. A population of empty storage and transport boxes in the semiconductor manufacturing plant 1 is now considered, their respective concentrations of critical gas are measured, by calculating their mean M and their standard deviation $\sigma$. The value lim 2 may, for example, may be chosen as equal to: lim $2=M+3\sigma$. The value lim 3 may, for example, may be chosen as equal to: lim $3=M+6\sigma$.

The positive effect of internal vacuum decontamination has been noted. When manufacturing electronic chips, for the metallic levels between when the lines are etched and when they are filled with copper, crystallization problems appear during the wait time after etching. These problems are due to the presence of fluoridated species which degas the substrate, and the presence of humidity in the clean room. By using internal vacuum decontamination, after etching the lines, the crystals do not appear, even if the wait time after vacuum-purging of the box is 20 hours. The result is greater flexibility in choosing how to move batches of substrates, as the duration of storage may be increased without risk of contamination.

The present invention is not limited to the embodiments that have been explicitly described; rather, it includes any variations and generalizations within the reach of a person skilled in the art.

The invention claimed is:

1. A device for handling substrates within a semiconductor manufacturing plant having substrate processing equipment, substrate storage means, substrate transport means, and a manufacturing execution system (MES) functionally related with the substrate processing equipment, with the substrate storage means and with the substrate transport means, comprising:

at least one substrate storage and transport box that is transported by the transport means and stored in the storage means;

at least one internal decontamination station which contains a vacuum when closed in order to internally decontaminate at least one transport and storage box or at least one open, thermal decontamination station containing a vacuum for the open decontamination of at least one empty storage and transport box where the box surfaces are subjected to the combined action of subatmospheric gas pressure and infrared radiation, with the storage and transport box being open, at least one gas analysis means for analyzing the gases forming an internal atmosphere of the substrate storage and transport box, which produces analysis signals representative of the quantity of a critical gas that is able to generate molecular contamination, which is present in the storage and transport box, the gas analysis means being distributed at the output of a substrate processing equipment or integrated into one or more substrate storage means or coupled to one or more decontamination stations, the gas analysis means comprising a gas analysis cell to bring the internal atmosphere of the storage and transport box in contact with a gas analysis cell, where the molecules undergo ionization, in order to analyze their mobility, an execution device which pilots the transport means and the storage means, to selectively directing the storage and transport box to a storage means or to a decontamination station as a function of the result of the gas analysis, the execution device comprising instructions for detecting a molecular decontamination need as a function of analysis signals emitted by the gas analysis device, and wherein if the concentration of at least one critical gas detected by the gas analysis means reaches limits beyond which decontamination or rejected are necessary, the order is given to the transport means to send the substrate storage and transport box either into the substrate storage means or into a reject area or to an open thermal decontamination station.

2. A device according to claim 1, wherein the execution device is incorporated into the manufacturing execution system (MES).

3. A device according to claim 1, wherein a program saved in the execution device contains:

instructions for producing and scanning the analysis signals, instructions for carrying out a comparison between the analysis signals and recorded threshold values (lim1, lim2, lim3), instructions for piloting the transport means and the storage means depending on the result of this comparison.

4. A device according to claim 3, wherein:

the program saved in the execution device further contains instructions for simulating the foreseeable change in contamination within the substrate storage and transport box as a function of analysis signals, the instructions for piloting the transport means and the storage means act as a function of the simulation result.

5. A device according to claim 3, wherein:

the device further comprises at least one internal decontamination station which contains a vacuum when closed in order to internally decontaminate at least one transport and storage box, the program saved in the execution device further contains instructions for detecting an internal decontamination need of the storage and transport box and to command the transport means and internal decontamination means in order to ensure the internal decontamination of the storage and transport box.

6. A device according to claim 5, wherein the program saved in the execution device further contains instructions for ordering the analysis of the gases in a storage and transport box at the outlet of a substrate processing equipment, to convey the storage and transport box to the storage means if the level of a critical gas measured by the gas analysis means, is less than a first predetermined threshold (lim1), and to convey the storage and transport box to the internal decontamination station containing a vacuum if the measured level of critical gas is greater than said first predetermined threshold (lim1).

7. A device according to one of the claim 1, comprising:
at least one open, thermal decontamination station containing a vacuum for the open decontamination of at least one empty storage and transport box,
the program saved in the execution device further contains instructions for detecting an open, thermal decontamination need involving a vacuum and for ordering the transport means and open decontamination means in order to ensure the open vacuum decontamination of the storage and transport box, or in order to ensure its quarantining.

8. A device according to claim 7, wherein the program saved in the execution device further contains instructions for ordering the analysis of the gases in an empty storage and transport box after a waiting time following its being cleaned, to convey the empty storage and transport box into the open, thermal decontamination station containing a vacuum for desorption for a period of time less than 5 hours if the measured level of a critical gas in the storage and transport box is between a second predetermined threshold (lim2) and a third predetermined threshold (lim3), and to convey the storage and transport box into the open, thermal decontamination station containing a vacuum for desorption for a period of time greater than 10 hours if the measured level of critical gas is greater than the third predetermined threshold (lim3).

9. A method for handling substrates within a semiconductor manufacturing plant having substrate processing equipment, substrate storage means, substrate transport means, and a manufacturing execution system (MES) functionally related with the substrate processing equipment, the substrate storage means and the substrate transport means, the method comprising:
distributing the substrates into batches each contained within a storage and transport box;
analyzing, via a gas analysis means, the gases forming an internal atmosphere of a storage and transport box and producing analysis signals representative of the quantity of a critical gas that is able to generate molecular contamination which is present in the storage and transport box, bringing the internal atmosphere of the storage and transport box in contact with a gas analysis cell of the gas analysis means, where the molecules undergo ionization, in order to analyze their mobility;
selectively directing, via an execution device, the storage and transport box to a storage means or to a decontamination station as a function of the result of the gas analysis; and
internally decontaminating at least one transport and storage box in the decontamination station which contains a vacuum when closed or internally decontaminating at least one transport and storage box in at least one open, thermal decontamination station containing a vacuum for the open decontamination of at least one empty storage and transport box wherein internally decontaminating comprises subjecting surfaces of an open transport and storage box to the combined action of subatmospheric gas pressure and infrared radiation; and
executing, via the execution device, instructions for detecting a molecular decontamination need as a function of analysis signals emitted by the gas analysis means; and
in response to the concentration of at least one critical gas detected by the gas analysis means reaching limits beyond which decontamination or rejection are necessary transporting the storage and transport box, via the transport means, into one of: (1) the substrate storage means; or (2) into a reject area; or (3) to the open thermal decontamination station.

10. A method according to claim 9, wherein the storage and transport box is decontaminated in a vacuum while closed if the measured level of a critical gas in the internal atmosphere of the storage and transport box is greater than a first predetermined threshold (lim1).

11. A method according to claim 9, wherein the storage and transport box is decontaminated in a vacuum while open for a period of time less than 5 hours if the measured level of a critical gas in the empty, closed storage and transport box is, after a wait time longer than 2 hours, between a second predetermined threshold (lim2) and a third predetermined threshold (lim3), and for a period of time longer than 10 hours if said measured level of critical gas is greater than the third predetermined threshold (lim3).

12. A method according to claim 9, further comprising learning in order to determine permissible limits past which defects may appear in the products manufactured by the method.

13. A method according to claim 9, wherein analyzing the gases in the internal atmosphere of a storage and transport box is carried out periodically during its storage in the storage means.

* * * * *